United States Patent [19]

Miyashita et al.

[11] Patent Number: 5,753,406

[45] Date of Patent: *May 19, 1998

[54] RADIATION-SENSITIVE RESIN COMPOSITION

[75] Inventors: Satoshi Miyashita; Akihiro Yamanouchi, both of Yokkaichi; Ikuo Nozue, Kobe; Takao Miura, Yokkaichi, all of Japan

[73] Assignee: Japan Synthetic Rubber Co., Ltd., Tokyo, Japan

[*] Notice: The portion of the term of this patent subsequent to Jun. 19, 2011, has been disclaimed.

[21] Appl. No.: 18,221

[22] Filed: Feb. 16, 1993

Related U.S. Application Data

[63] Continuation of Ser. No. 841,300, Feb. 28, 1992, abandoned, which is a continuation of Ser. No. 464,673, Jan. 10, 1990, abandoned, which is a continuation-in-part of Ser. No. 421,328, Oct. 13, 1989, abandoned.

[30] Foreign Application Priority Data

Oct. 18, 1988 [JP] Japan ................................. 63-262084
Jan. 11, 1989 [JP] Japan ................................. 1-4508

[51] Int. Cl.$^6$ ................................. G03F 7/023
[52] U.S. Cl. ................................. 430/191; 430/192; 430/193; 430/326
[58] Field of Search ................................. 430/165, 191, 430/192, 193, 326

[56] References Cited

U.S. PATENT DOCUMENTS

| | | | |
|---|---|---|---|
| 4,477,553 | 10/1984 | Yamamoto et al. | 430/192 |
| 4,797,346 | 1/1989 | Yamamoto et al. | 430/165 |
| 4,971,887 | 11/1990 | Schmitt et al. | 430/193 |
| 4,988,601 | 1/1991 | Ushirogouchi et al. | 430/192 |
| 5,019,479 | 5/1991 | Oka et al. | 430/192 |
| 5,087,548 | 2/1992 | Hosaka et al. | 430/193 |

OTHER PUBLICATIONS

U.S. application No. 08/008,661, filed Jan. 25, 1993.
U.S. application No. 08/018,221, filed Feb. 16, 1993.

*Primary Examiner*—John S. Chu
*Attorney, Agent, or Firm*—Oblon, Spivak, McClelland, Maier & Neustadt, P.C.

[57] ABSTRACT

A radiation-sensitive resin composition comprising an alkali-soluble novolak resin and a 1,2-quinonediazide compound, wherein the alakli-soluble novolak resin comprises a mixture of:

95–50 parts by weight of Resin A having a standard polystyrene-reduced weight-average molecular weight of 2,000–20,000 [Resin A is at least one resin selected from the group consisting of a resin obtained by polycondensation of m-cresol and at least one phenol represented by the structural formula (I) or (I'):

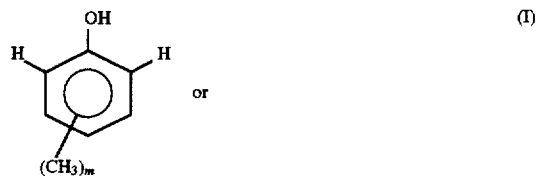

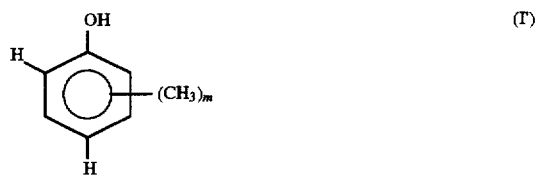

wherein m is 2 or 3, with at least one aldehyde and a resin obtained by polycondensation of m-cresol, p-cresol and at least one phenol represented by the above structural formula (I) or (I') with at least one aldehyde] and 5–50 parts by weight of Resin B having a standard polystyrene-reduced weight-average molecular weight of 200–2,000 [Resin B is a resin obtained by polycondensation of at least one phenol represented by the structural formula (II):

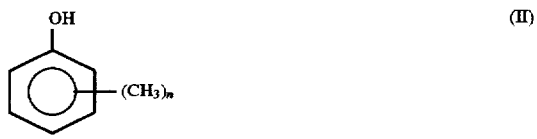

wherein n is 0, 1, 2 or 3, with at least one aldehyde]. In the resin composition, the mixture of Resin A and Resin B may further contain Resin C which is an ester of Resin B with a 1,2-quinonediazidesulfonic acid.

21 Claims, No Drawings

RADIATION-SENSITIVE RESIN COMPOSITION

This is a continuation of application Ser. No. 07/841,300, filed on Feb. 28, 1992, now abandoned, which is a continuation of Ser. No. 07/464,673 filed Jan. 10, 1990, now abandoned, which is a continuation-in-part of Ser. No. 07/421,328 filed Oct. 13, 1989, now abandoned.

This invention relates to a radiation-sensitive resin composition. More particularly, this invention relates to a radiation-sensitive resin composition suitable for use as a positive type resist which is sensitive to radiations such as ultraviolet rays, deep ultraviolet rays, X-rays, electron beam, molecular beam, gamma rays, synchrotron radiation, proton beam and the like and which is used for production of highly integrated circuits.

Positive type resists are being used in a large amount in the production of integrated circuits because a resist pattern of high resolution can be obtained from the positive type resists.

The recent progress of integrated circuits into a higher integration requires a positive type resist capable of forming a resist pattern of higher resolution. That is, when a positive type resist is used to form a fine resist pattern, the resist is exposed to a light to form a latent image and then developed with a developing solution (an aqueous alkali solution) to obtain an image; at this time, it is necessary that the exposed portion can be developed rapidly to its part contacting the wafer, i.e. the foot of the pattern. In conventional positive type resists, when they are used to form a resist pattern having a line-to-line distance of 1 μm or less, the developability at the foot of the resist pattern is poor and the degree of resolution becomes low.

With an enhancement of the integration degree of integrated circuits, wafer etching system is changing from the conventional wet etching (this gives large side etching) to dry etching (this gives small side etching). In this dry etching, it is necessary that the resist pattern does not change during the etching and accordingly a heat-resistant resist is required to be used. Conventional positive type resists cannot be considered to have sufficient heat resistance.

An object of this invention is to solve the above-mentioned problems of the prior art and to provide a radiation-sensitive resin composition which is suitable for use as a positive type resist having a high sensitivity, an excellent developability, a high resolution and excellent heat resistance.

Other objects and advantages of this invention will become apparent from the following description.

According to this invention, there is provided a radiation-sensitive resin composition comprising an alkali-soluble novolac resin and a 1,2-quinonediazide compound, wherein the alkali-soluble novolac resin comprises a mixture of:

95–50 parts by weight of Resin A having a standard polystyrene-reduced weight-average molecular weight of 2,000–20,000 [Resin A is at least one resin selected from the group consisting of a resin obtained by polycondensation of m-cresol and at least one phenol represented by the structural formula (I) or (I'):

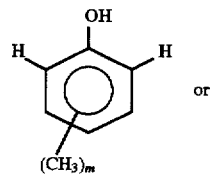

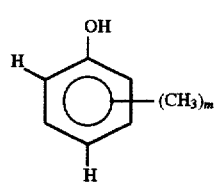

wherein m is 2 or 3, with at least one aldehyde and a resin obtained by polycondensation of m-cresol, p-cresol and at least one phenol represented by the above structural formula (I) or (I') with at least one aldehyde] and 5–50 parts by weight of Resin B having a standard polystyrene-reduced weight-average molecular weight of 200–2,000 [Resin B is a resin obtained by polycondensation of at least one phenol represented by the structural formula (II):

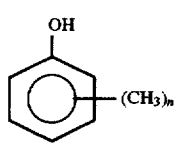

wherein n is 0, 1, 2 or 3, with at least one aldehyde] (the resin composition is hereinafter referred to as "Composition A").

According to this invention, there is further provided a radiation-sensitive resin composition comprising an alkali-soluble novolak resin and a 1,2-quinonediazide compound, wherein the alkali-soluble novolak resin comprises a mixture of:

50–95 parts by weight of Resin A having a standard polystyrene-reduced weight-average molecular weight of 2,000–20,000 [Resin A is at least one resin selected from the group consisting of a resin obtained by polycondensation of m-cresol and at least one phenol represented by the structural formula (I) or (I'):

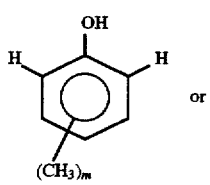

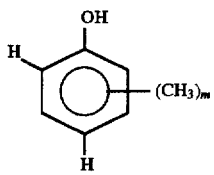

wherein m is 2 or 3, with at least one aldehyde and a resin obtained by polycondensation of m-cresol, p-cresol and at least one phenol represented by the above structural formula (I) or (I') with at least one aldehyde], 0–45 parts by weight of Resin B having a standard polystyrene-reduced weight-average molecular weight of 200–2,000 [Resin B is a resin obtained by polycondensation of at least one phenol represented by the structural formula (II):

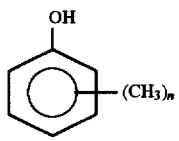

wherein n is 0, 1, 2 or 3, with at least one aldehyde], and 5–50 parts by weight of Resin C (Resin C is an ester of Resin B with 1,2-quinonediazidesulfonic acid) (the resin composition is hereinafter referred to as "Composition B").

The phenols represented by the structural formulas (I) and (I') [hereinafter referred to as "the phenols (I)"] used in this invention include 2,3-xylenol, 2,5-xylenol, 3,4-xylenol, 3,5-xylenol, 2,3,5-trimethylphenol and 3,4,5-trimethylphenol. Of these, 3,5-xylenol and 2,3,5-trimethylphenol are preferred.

The phenols represented by the structural Formula (II) [hereinafter referred to as "the phenols (II)"] include phenol, o-cresol, m-cresol, p-cresol, 2,3-xylenol, 2,4-xylenol, 2,5-xylenol, 2,6-xylenol, 3,4-xylenol, 3,5-xylenol, 3,6-xylenol, 2,3,5-trimethylphenol and 3,4,5-trimethylphenol. Of these, m-cresol, o-cresol, p-cresol, 3,5-xylenol and 2,3,5-trimethylphenol are preferred.

The phenols (I) can be used alone or in admixture of two or more, and the phenols (II) can also be used alone or in admixture of two or more.

The aldehyde used in this invention includes formaldehyde, paraformaldehyde, benzaldehyde, furfural and acetaldehyde. Of these, formaldehyde is particularly preferred. These aldehydes can be used alone or in a smixture of two or more.

Resin A used in this invention has a standard polytyrene-reduced weight-average molecular weight (hereinafter referred to as "$\overline{Mw}$") of 2,000–20,000, preferably 4,000–20,000 and particularly preferably 5,000–15,000 and is obtained by polycondensation of m-cresol and at least one of the phenols (I) or n-cresol, p-cresol and at least one of the phenols (I) with at least one of the aldehydes in the presence of an acidic catalyst. When the $\overline{Mw}$ is more than 20,000, it is difficult to uniformly coat the resulting composition on a wafer and the resulting composition has reduced developability and reduced sensitivity. When the $\overline{Mw}$ is less than 4,000, the resulting composition has reduced heat resistance.

Also, Resin A is preferably such that when the maximum heights of peaks of a curve obtained by gel permeation chromatography in the ranges of polystyrene-reduced weight-average molecular weight of from 6,300 to 25,000, from 2,500 to 6,000 and from 150 to 900 are defined as a, b and c, respectively, a/b=0–1.5 and c/b=0–2, and more preferably such that a/b=0.2–1.3 and c/b=0–1.5. In some cases, when the a/b value exceeds 1.5, the developability and sensitivity are deteriorated and when the c/b value exceeds 2, the heat resistance and developability are deteriorated.

Resin B used in this invention has a $\overline{Mw}$ of 200–2,000, preferably 300–1,000 and is obtained by polycondensation of at least one of the phenols (II), preferably m-cresol and at least one of the phenols (II) other than m-cresol with at least one of the aldehydes in the presence of an acidic catalyst. When the $\overline{Mw}$ is more than 2,000, the resulting composition has reduced sensitivity and reduced developability. When the $\overline{Mw}$ is less than 200, the composition has reduced heat resistance.

The amounts of m-cresol, p-cresol, at least one of the phenols (I) and at least one of the phenols (II) used (these phenols are hereinafter referred to generically as "the phenols") are such that in Resin A, the molar ratio of m-cresol/the phenols (I) is usually 20/80 to 95/5, preferably, 40/60 to 95/5, more preferably 50/50 to 90/10 in the case where m-cresol and the phenols (I) are used in combination and the molar ratio of m-cresol/p-cresol/ the phenols (I) is usually 20–90/5–75/5–75, preferably 40–80/10–50/10–50 in the case where m-cresol, p-cresol and the phenols (I) are used in combination, and in Resin B, the molar ratio of m-cresol/the phenols (II) other than m-cresol is preferably 95/5 to 5/95.

An acidic catalyst is used in the above polycondensations, and it may be an inorganic acid such as hydrochloric acid, nitric acid, sulfuric acid or the like, or an organic acid such as formic acid, oxalic acid, acetic acid or the like.

The amount of the aldehyde used is preferably 0.7–3 moles, particularly preferably 0.8–1.5 moles, per mole of the phenols in the case of Resin A, and preferably 0.1–1.5 moles, particularly preferably 0.15–0.6 mole, per mole of the phenols in the case of Resin B. The amount of the acidic catalyst used is usually $1\times10^{-5}$ to $5\times10^{-1}$ mole per mole of the phenols.

Water is ordinarily used as a reaction medium in the polycondensation. A hydrophilic solvent may be used as a reaction medium when the phenols used in the polycondensation are insoluble in an aqueous solution of the aldehyde and the reaction system becomes non-uniform from the start of the reaction. The hydrophilic solvent includes, for example, alcohols such as methanol, ethanol, propanol, butanol and the like, and cyclic ethers such as tetrahydrofuran, dioxane and the like. The amount of the reaction medium is usually 20–1,000 parts by weight per 100 parts by weight of the reaction materials.

The polycondensation temperature can be varied appropriately depending upon the reactivities of the reactants but is usually 10°–200° C., preferably 70°–130° C.

The polycondensation can be effected according to, for example, a method wherein the phenols, the aldehyde, the acidic catalyst, etc. are charged at one time, or a method wherein the phenols, the aldehyde, etc. are added gradually with the progress of the reaction, in the presence of an acidic catalyst.

After the completion of the polycondensation, in order to remove the unreacted materials, acidic catalyst and reaction medium present in the system, the internal temperature of the reaction vessel is generally elevated to 130°–230° C. and made vacuum (e.g. about 20–50 mmHg) to distil off the volatile components, thereby recovering Resin A or B.

In order to obtain Resin A having a high $\overline{Mw}$, it is possible to dissolve the recovered resin in a good solvent such as ethyl cellosolve acetate, dioxane, methanol or the like, mix the resulting solution with a poor solvent such as water, n-hexane, n-heptane or the like and separate the precipitated resin solution layer to recover Resin A on the higher molecular weight side.

In Composition A of this invention, the amount of Resin A is 95–50 parts by weight, preferably 90–60 parts by weight, and the amount of Resin B is 5–50 parts by weight, preferably 10–40 parts by weight (the total amount of Resins A and B is 100 parts by weight). when the amount of Resin A is more than 95 parts by weight, the resulting composition has poor developability. When the amount is less than 50 parts by weight, the resulting composition has reduced heat resistance.

Resin C used in Composition B of this invention can be obtained by esterifying Resin B with a 1,2-quinonediazidesulfonic acid chloride in the presence of a basic catalyst. Preferably, Resin B used in this esterification has a $\overline{Mw}$ of 200–1,500.

The 1,2-quinonediazidesulfonic acid chloride includes 1,2-benzoquinonediazide-4-sulfonic acid chloride, 1,2-naphthoquinonediazide-4-sulfonic acid chloride, 1,2-naphthoquinonediazide-5-sulfonic acid chloride, etc. Of these, preferred are 1,2-naphthoquinonediazide-5-sulfonic acid chloride (hereinafter referred to as "NQD-5") and 1,2-naphthoquinonediazide-4-sulfonic acid chloride (hereinafter referred to as "NQD-4").

The basic catalyst includes amines such as trimethylamine, triethylamine, diethylamine, tripropylamine, tributylamine, pyridine and the like, and inorganic alkalis such as sodium hydroxide, potassium hydroxide and the like. The amount of the basic catalyst used is usually 0.8–2 moles, preferably 1–1.5 moles, per mole of the 1,2-quinonediazidesulfonic acid chloride. The proportion of the 1,2-quinonediazidesulfonic acid chloride used to Resin B is 0.5–2.5, preferably 0.75–2 by weight.

The esterification is effected usually in the presence of a solvent. The solvent includes, for example, acetone, dioxane, methyl ethyl ketone, N,N-dimethylacetamide, etc. The amount of the solvent used is usually 1–10 times the weight of the reactants.

An example of the purification method employed after the esterification reaction is a method comprising removing the precipitated hydrochloride produced as a by-product by filtration, or dissolving the precipitated hydrochloride in water, mixing the resulting solution with a large amount of an aqueous acid solution (e.g. diluted hydrochloric acid) to reprecipitate the product, and then drying the product.

Resin C thus obtained has usually a $\overline{Mw}$ value of 220 to 2,500.

Also, the degree of esterification of Resin C is represented by the following equation:

$$\text{Degree of estrification of Resin (C)} = \frac{[\text{Number of 1,2-quinonediazidesulfonate groups bonded to Resin C}]}{[\text{Number of hydroxyl groups in Resin }B\text{ before esterification}]} \times 100$$

and is preferably 20–90%, particularly preferably 25–80%. In some cases, when the degree of esterification of Resin C is less than 20%, the developability and exposure margin of Resin C are deteriorated and when it exceeds 90%, the sensitivity and developability are deteriorated.

In Composition B of this invention, the amount of Resin A is 50–95 parts by weight, preferably 60–90 parts by weight, the amount of Resin B is 0–45 parts by weight, preferably 5–35 parts by weight, and the amount of Resin C is 5–50 parts by weight, preferably 5–35 parts by weight, the total amount of Resins A, B and C being 100 parts by weight. When the amount of Resin A is more than 95 parts by weight, the resulting composition has reduced resolution and reduced sensitivity, and the exposure margin becomes narrow. When the amount is less than 50 parts by weight, the resulting composition has reduced heat resistance. When the amount of Resin B is more than 45 parts by weight, the resulting composition has reduced heat resistance. When the amount of Resin C is more than 50 parts by weight, the resulting composition has reduced sensitivity. When the amount is less than 5 parts by weight, the resulting composition has reduced developability.

The 1,2-quinonediazide compound used in Compositions A and B of this invention includes, for example, 1,2-benzoquinonediazide-4-sulfonic acid esters, 1,2-naphthoquinonediazide-4-sulfonic acid esters, 1,2-naphthoquinonediazide-5-sulfonic acid esters, etc. Specific examples of the 1,2-quinonediazide compound are 1,2-benzoquinonediazide-4-sulfonic acid esters, 1,2-naphthoquinonediazide-4-sulfonic acid esters and 1,2-naphthoquinonediazide-5-sulfonic acid esters of (poly) hydroxybenzenes such as p-cresol, resorcinol, phloroglucinol, pyrogallol and the like; 1,2-benzoquinonediazide-4-sulfonic acid esters, 1,2-naphthoquinonediazide-4-sulfonic acid esters and 1,2-naphthoquinonediazide-5-sulfonic acid esters of (poly) hydroxyphenyl alkyl ketones or (poly)hydroxyphenyl aryl ketones such as 2,4-dihydroxyphenyl propyl ketone, 2,4-dihydroxyphenyl n-hexyl ketone, 2,4-dihydroxybenzophenone, 2,3,4-trihydroxyphenyl n-hexyl ketone, 2,3,4-trihydroxybenzophenone, 2,4,6-trihydroxybenzophenone, 2,3,4,4'-tetrahydroxvbenzophenone, 2,3,4,4'-tetrahydroxy-3'-methoxybenzophenone, 2,2',4,4'-tetrahydroxybenzophenone, 2,2',3,4,6'-pentahydroxybenzophenone, 2,3,3',4,4',5'-hexahydroxybenzophenone, 2,3',4,4',5',6-hexahydroxybenzophenone and the like; 1,2-benzoquinonediazide-4-sulfonic acid esters, 1,2-naphthoquinonediazide-4-sulfonic acid esters and 1,2-naphthoquinonediazide-5-sulfonic acid esters of bis [(poly) hydroxyphenyl]alkanes such as bis(p-hydroxyphenyl) methane, bis(2,4-dihydroxyphenyl)methane, bis-(2,3,4-trihydroxyphenyl)methane, 2,2-bis(p-hydroxypheny)-propane, 2,2-bis(2,4-dihydroxyphenyl)propane, 2,2-bis-(2,3,4-trihydroxyphenyl)propane and the like; 1,2-benzoquinonediazide-4-sulfonic acid esters, 1,2-naphthoquinonediazide-4-sulfonic acid esters and 1,2-naphthoquinonediazide-5-sulfonic acid esters of alkyl (poly) hydroxybenzoates or aryl (poly)hydroxybenzoates such as lauryl 3,5-dihydroxybenzoate, phenyl 2,3,4-trihydroxybenzoate, lauryl 3,4,5-trihydroxybenzoate, propyl 3,4,5-trihydroxybenzoate, phenyl 3,4,5-trihydroxy-benzoate and the like; 1,2-benzoquinonediazide-4-sulfonic acid esters, 1,2-naphthoquinonediazide-4-sulfonic acid esters and 1,2-naphthoquinonediazide-5-sulfonic acid esters of bis [(poly)hydroxybenzoyl]alkanes or bis-(poly) hydroxybenzoyl benzenes such as bis(2,5-dihydrobenzoyl) methane, bis(2,3,4-trihydroxybenzoyl)methane, bis(2,4,6-trihydroxybenzoyl)methane, p-bis(2,5-dihydroxybenzoyl) benzene, p-bis(2,3,4-trihydroxy-benzoyl)benzene, p-bis(2,4,6-trihydroxybenzoyl)benzene and the like; and 1,2-benzoquinonediazide-4-sulfonic acid esters, 1,2-naphthoquinonediazide-4-sulfonic acid esters and 1,2-naphthoquinonediazide-5-sulonic acid esters of (poly) ethylene glycol di[(poly)hydroxybenzoates] such as ethylene glycol di(3,5-dihydroxybenzoate), polyethylene glycol di(3,5-dihydroxybenzoate), polyethylene glycol di(3,4,5-trihydroxybenzoate) and the like. Besides the above compounds, there can also be used 1,2-quinonediazide compounds described in J. Kosar, "Light-Sensitive Systems", 339–352 (1965), John Wiley & Sons Co. (New York) and W. S. De Forest, "Photoresist" 50, (1975), McGraw-Hill, Inc. (New York).

Of the above 1,2-quinonediazide compounds, particularly preferable are 1,2-naphthoquinonediazide-sulfonic acid esters of trihydroxybenzophenone such as 2,3,4-trihydroxybenzophenone-1,2-naphthoquinonediazide-4-sulfonic acid ester, 2,3,4-trihydroxybenzophenone-naphthoquinonediazide-5-sulfonic acid ester, 2,4,6-trihydroxybenzophenone-1,2-naphthoquinonediazide-4-sulfonic acid ester and 2,4,6-trihydroxybenzophenone-1,2-naphthoquinonediazide-5-sulfonic acid ester; and 1,2-naphthoquinonediazidesulfonic acid esters of tetrahydroxybenzophenone such as 2,2',4,4'-tetrahydroxybenzophenone-1,2-naphthoquinonediazide-4-sulfonic acid ester, 2,2',4,4'-tetrahydroxybenzophenone-1,2- naphthoquinonediazide-5-sulfonic acid ester, 2,3,4,4'-tetrahydroxybenzophenone-1,2-naphthoquinonediazide-4-sulfonic acid ester, 2,3,4,4'-tetrahydroxybenzophenone-1,2-naphthaoquinonediazide-5-sulfonic acid ester, 2,3,4,4'-tetrahydroxy-3'-methoxybenzophenone-1,2-naphthoquinonediazide-4-sulfonic acid ester and 2,3,4,4'-tetrahydroxy-3'-methoxybenzophenone-1,2-naphthoquinonediazide-5-sulfonic acid ester. The number (condensation ratio) of 1,2-naphthoquinonediazide-sulfonic acid groups bonding to trihydroxybenzophenone or tetrahydroxybenzophenone to form ester linkages is preferably 1.5–3 on an average in the case of trihydroxybenzophenone-1,2-naphthoquinonediazidesulfonic acid ester and 2–4 on an average in the case of tetrahydroxybenzophenone-1,2-naphthoquinonediazidesulfonic acid ester.

The above 1-2-quinonediazide compounds are used alone or in admixture of two or more.

The amount of the 1,2-quinonediazide compound used in Composition A or B of this invention is preferably 5–100 parts by weight, particularly preferably 10–50 parts by weight, based on 100 parts by weight of the total of Resins A and B or Resins A, B and C. When the amount is too small, the resulting composition has no sufficient difference in solubility in developing solution, between the radiation-irradiated portions and the non-irradiated portions, thus resulting in an difficulty in patterning. When the amount is too large, the resulting composition tends to have reduced developability.

Compositions A and B of this invention may further comprise a sensitizer in order to increase its sensitivity to radiations. The sensitizer includes, for example, 2H-pyrido[3,2-b]-1,4-oxazine-3[4H]ones, 10H-pyrido [3,2-b] [1,4]-benzothiazines, urazoles, hydantoins, barbituric acids, glycine anhydride, 1-hydroxybenzotriazoles, alloxans, maleimides and the like. The amount of the sensitizer used is usually not more than 100 parts by weight, preferably not more than 60 parts by weight, per 100 parts by weight of the 1,2-quinonediazide compound.

Moreover, the present Compositions A and B may contain a surface active agent for improving the coatability, for example, striation, and the developability of the radiation-irradiated portions after the formation of dry film. The surface active agent includes, for example, nonionic surfactants e.g. polyoxyethylene alkyl ethers such as polyoxyethylene lauryl ether, polyoxyethylene stearyl ether, polyoxyethylene oleyl ether and the like; polyoxyethylene alkylphenyl ethers such as polyoxyethylene octylphenyl [ether, polyoxyethylene nonylphenyl ether and the like; difatty acid esters of polyethylene glycol such as polyethylene glycol dilaurate, polyethylene glycol distearate and the like]; fluorine-containing surfactants such as F Top EF 301, EF 303 and EF 352 (these are products of Shin Akita Kasei K.K.), Megafac F 171, F 172 and F 173 (these are products of DAINIPPON INK & CHEMICALS), Fluorad FC 430 and FC 431 (these are products of Sumitomo 3M Limited), and Asahi Guard AG 710 and Surflon S-382, SC 101, SC 102, SC 103, SC 104, SC 105 and SC 106 (these are products of Asahi Glass Co., Ltd.); organosiloxane polymer KP 341 (a product of Shin-Etsu Chemical Co., Ltd.); and acrylic or methacrylic acid (co)polymers Polyflow No. 75 and No. 95 (these are products of Kyoeisha Yushikagaku Kogyo K.K.). The amount of the surface active agent used is usually 2% by weight or less, preferably 1% by weight or less, based on the solids content of Composition A or B.

Compositions A and B of this invention may further contain a dye and a pigment in order to visualize the latent image of the radiation-irradiated portions and minimize the effect of halation during the irradiation with a radiation, and an adhering aid in order to improve the adhesiveness to a substrate.

Compositions A and B of this invention may further contain, if necessary, a storage stability improver, an anti-foaming agent, etc.

The method of coating Composition A or B of this invention on a substrate such as a silicon wafer or the like comprises dissolving Composition A or B in a solvent so that the concentration (in terms of solids content) becomes, for example, 20–40% by weight, filtering the resulting solution through a filter having a pore diameter of, for example, about 0.2 μm and coating the filtrate on a substrate such as a silicon wafer or the like by spin-coating, flow-coating, roll-coating or the like. The solvent used in this operation includes, for example, glycol ethers such as ethylene glycol monomethyl ether, ethylene glycol monomethyl ether and the like; ethylene glycol alkyl ether acetates such as methyl cellosolve acetate, ethyl cellosolve acetate and the like; diethylene glycol monoalkyl ethers such as diethylene glycol monomethyl ether, diethylene glycol monoethyl ether and the like; propylene glycol alkyl ether acetates such as propylene glycol methyl ether acetate, propylene glycol ethyl ether acetate, propylene glycol propyl ether acetate and the like; aromatic hydrocarbons such as toluene, xylene and the like; ketones such as methyl ethyl ketone, cyclohexanone and the like; and esters such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutanoate, 3-methyl-3-methoxybutyl acetate, 3-methyl-3-methoxybutyl propionate, 3-methyl-3-methoxybutyl butyrate, ethyl acetate, butyl acetate and the like. There can also be added high boiling solvents such as benzyl ethyl ether, dihexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, gamma-butyrolactone, ethylene carbonate, propylene carbonate, phenyl cellosolve acetate and the like.

As the developing solution for Composition A or B of this invention, there can be used aqueous alkali solutions obtained by dissolving in water, for example, an inorganic alkali such as sodium hydroxide, potassium hydroxide, sodium carbonate, sodium silicate, sodium metasilicate, ammonium water or the like; a primary amine such as ethylamine, n-propylamine or the like; a secondary amine such as diethylamine, di-n-propylamine or the like; a tertiary amine such as triethylamine, methyldiethylamine or the like; an alcoholamine such as dimethylethanolamine, triethanolamine or the like; a quaternary ammonium salt such as tetramethylammonium hydroxide, tetraethylammonium hydroxide or the like; or a cyclic amine such as pyrrole, piperidine, 1,8-diazabicyclo [5,4,0]-7-undecene, 1,5-diazabicyclo [4,3,0]-5-nonane or the like.

The developing solution may further contain appropriate amounts of a water-soluble organic solvent, for example, an alcohol such as methanol, ethanol or the like, and a surface active agent as mentioned above.

This invention will be explained in more detail below referring to Synthesis Examples and Examples. However, this invention should not be interpreted to be restricted to the Synthesis Examples and Examples.

In the Examples, Mw was measured according to a gel permeation chromatography (GPC) using GPC columns consisting of two G200H$_6$ columns, one G300H$_6$ column and one C-4000H$_6$ column (manufactured by Tosoh Corp.)

and using, as a standard, a monodisperse polystyrene under the analytical conditions that the flow rate was 1.5 ml/min, the eluent was tetrahydrofuran and the column temperature was 40° C.

Resist properties were evaluated according to the following test methods.

Sensitivity

A resist was exposed to a light using a stepper (NSR1505G4D manufactured by NIPPON KOGAKU K.K.), was subjected to development for 60 seconds at 25° C. using an aqueous solution containing 2.4% by weight of tetramethylammonium hydroxide, rinsed with water, and dried to form a resist pattern on a wafer. This procedure was repeated with varying the exposure time, to examine an exposure time capable of forming a "line and space" pattern of 0.8 μm at a 1:1 width ratio (this exposure time is hereinafter referred to as "optimum exposure time").

Resolution

The dimension of a minimum resist pattern at optimum exposure time was measured.

Yield of Residual Film Thickness

Measured there the film thickness of a resist before development and the thickness of a pattern formed from the resist. Then, a ratio of the latter thickness to the former thickness was calculated.

Developability

The degree of scum and insufficient development seen on the resist after development was examined.

Heat Resistance

A wafer having formed thereon a resist pattern was placed in a clean oven, and the temperature at which the pattern began to deform was measured.

Exposure Margin

The exposure time ($E_{th}$) at which the film thickness in the exposed portion becomes 0 after exposure is divided by the above optimum exposure time ($E_{op}$) and the exposure margin is indicated as the resulting value ($E_{th}/E_{op}$). The smaller this value, the broader the exposure margin.

SYNTHESIS EXAMPLE 1

Into a separable flask provided with a stirrer, a condenser and a thermometer were charged the following materials:

| | |
|---|---|
| m-Cresol | 104.0 g (0.962 mol) |
| 2,3,5-Trimethylphenol | 14.0 g (0.103 mol) |
| 37 wt. % aqueous formaldehyde solution (hereinafter referred to as formalin) | 125.3 g (1.544 mol) |
| Oxalic acid dihydrate | 1.558 g (0.012 mol) |

The separable flask was immersed in an oil bath, and the flask contents were subjected to polycondensation for 1 hour with stirring while maintaining the flask interior at 100° C. Then, the following materials were added:

| | |
|---|---|
| m-Cresol | 26.0 g (0.240 mol) |
| 2,3,5-Trimethylphenol | 56.1 g (0.412 mol) |

Polycondensation was effected for a further 2 hours to synthesize Resin A. After the completion of the reaction, the temperature of the oil bath was increased to 180° C. and simultaneously the pressure inside the reaction vessel was reduced to 30–40 mmHg to remove water, oxalic acid, unreacted formaldehyde and unreacted phenols. Then, the resulting molten Resin A was cooled to room temperature and recovered. Resin A was dissolved in ethyl cellosolve acetate so that the solids concentration became 20% by weight. To the resulting resin solution were added methanol in an amount two times the weight of the resin solution and water in the same amount as the weight of the resin solution. The mixture was stirred and then allowed to stand. The mixture was separated into two layers. The resin solution layer (lower layer) was taken out, concentrated, dehydrated and dried to recover Resin A [hereinafter referred to as "Resin A (1)"].

Resin A (1) was dissolved in tetrahydrofuran to measure its $\overline{Mw}$. The $\overline{Mw}$ was 8,100.

SYNTHESIS EXAMPLE 2 in the same separable flask as used in Synthesis Example 1 were charged the following materials:

| | |
|---|---|
| m-Cresol | 27.0 g (0.250 mol) |
| 3,5-Xylenol | 52.2 g (0.427 mol) |
| Formalin | 130.3 g (1.605 mol) |
| Oxalic acid dihydrate | 0.731 g (0.00580 mol) |

The separable flask was immersed in an oil bath, and the flask contents were subjected to polycondensation for 35 minutes with stirring while maintaining the flask interior at 100° C. Then, the following materials were added:

| | |
|---|---|
| m-Cresol | 108.0 g (0.999 mol) |
| 3,5-Xylenol | 13.1 g (0.107 mol) |

Polycondensation was effected for a further 90 minutes to synthesize Resin A. After the completion of the reaction, the temperature of the oil bath was increased to 180° C. and simultaneously the pressure inside the reaction vessel was reduced to 30–40 mmHg to remove water, oxalic acid, unreacted formaldehyde and unreacted phenols. The same subsequent procedure as in Synthesis Example 1 was repeated, whereby Resin A [hereinafter referred to as "Resin A (2)"] was recovered.

Resin A (2) was dissolved in tetrahydrofuran to measure its $\overline{Mw}$. The $\overline{Mw}$ was 7,500.

SYNTHESIS EXAMPLE 3

Into the same separable flask as used in Synthesis Example 1 were charged the following materials:

| | |
|---|---|
| m-Cresol | 100.0 g (0.925 mol) |
| p-Cresol | 100.0 g (0.925 mol) |
| Formalin | 37.5 g (0.462 mol) |
| Oxalic acid dihydrate | 0.559 g (0.0044 mol) |

The separable flask was immersed in an oil bath, and the flask contents were subjected to polycondensation for 30 minutes with stirring while maintaining the flask interior at 100° C. After the completion of the reaction, the temperature of the oil bath was increased to 180° C., and simultaneously the pressure inside the reaction vessel was reduced to 30–40 mmHg to remove water, oxalic acid, unreacted formaldehyde and unreacted phenols. The resulting molten resin was cooled to room temperature to recover Resin B [hereinafter referred to as "Resin B (1)"].

Resin B (1) was dissolved in tetrahydrofuran to measure its $\overline{Mw}$. The $\overline{Mw}$ was 590.

SYNTHESIS EXAMPLE 4

The same procedure as in Synthesis example 3 was repeated, except that the following materials were used, to synthesize Resin B [hereinafter referred to as "Resin B (2)"]:

| m-Cresol | 175.5 g (1.623 mol) |
| 2,3,5-Trimethylphenol | 24.5 g (0.180 mol) |
| Formalin | 36.6 g (0.451 mol) |
| Oxalic acid dihydrate | 1.636 g (0.0130 mol) |

Resin B (2) was dissolved in tetrahydrofuran to measure its $\overline{Mw}$. The $\overline{Mw}$ was 610.

SYNTHESIS EXAMPLE 5

The same procedure as in Synthesis Example 3 was repeated, except that the following materials were used, to synthesize Resin B [hereinafter referred to as "Resin B (3)"]:

| m-Cresol | 114.0 g (1.056 mol) |
| 3,5-Xylenol | 86.0 g (0.705 mol) |
| Formalin | 35.7 g (0.440 mol) |
| Oxalic acid | 0.731 g (0.0058 mol) |

Resin B (3) was dissolved in tetrahydrofuran to measure its $\overline{Mw}$. The $\overline{Mw}$ was 670.

SYNTHESIS EXAMPLE 6

Into the same separable flask as used in Synthesis Example 1 were charged the following materials:

| m-Cresol | 19.3 g (0.178 mol) |
| p-Cresol | 38.5 g (0.356 mol) |
| 3,5-Xylenol | 52.2 g (0.428 mol) |
| Formalin | 137.3 g (1.693 mol) |
| Oxalic acid dihdyrate | 0.731 g (0.00580 mol) |

The separable flask was immersed in an oil bath, and flask contents were subjected to polycondensation for 1 hour with stirring while maintaining the flask interior at 100° C. Then, the following materials were added:

| m-Cresol | 77.0 g (0.713 mol) |
| 3,5-Xylenol | 13.0 g (0.107 mol) |

Polycondensation was effected for a further 2 hours to synthesize Resin A. After the completion of the reaction, the temperature of the oil bath was increased to 180° C., and simultaneously the pressure inside the reaction vessel was reduced to 30–40 mmHg to remove water, oxalic acid, unreacted formaldehyde and unreacted phenols. The same subsequent procedure as in Synthesis Example 1 was repeated to recover Resin A [hereinafter referred to as "Resin A (3)"].

Resin A (3) was dissolved in tetrahydrofuran to measure its $\overline{Mw}$. The $\overline{Mw}$ was 8,900.

SYNTHESIS EXAMPLE 7

Into the same separable flask as used in Synthesis Example 1 were charged the following materials:

| m-Cresol | 74.2 g (0.687 mol) |
| p-Cresol | 37.1 g (0.344 mol) |
| 2,3,5-Trimethylphenol | 14.0 g (0.103 mol) |
| Formalin | 125.3 g (1.545 mol) |
| Oxalic acid dihydrate | 1.558 g (0.0124 mol) |

The separable flask was immersed in an oil bath, and polycondensation was effected for 30 minutes with stirring while maintaining the flask interior at 100° C. Then, the following materials were added:

| m-Cresol | 18.6 g (0.172 mol) |
| 2,3,5-Trimethylphenol | 56.1 g (0.413 mol) |

Polycondensation was effected for a further 2 hours to synthesize Resin A. After the completion of the reaction, the temperature of the oil bath was increased to 180° C., and simultaneously the pressure inside the reaction vessel was reduced to 30–40 mmHg to remove water, oxalic acid, unreacted formaldehyde and unreacted phenols. The same subsequent procedure as in Synthesis Example 1 was repeated to recover Resin A [hereinafter referred to as "Resin A (4)"].

Resin A (4) was dissolved in tetrahydrofuran to measure its $\overline{Mw}$. The $\overline{Mw}$ was 9,200.

EXAMPLE 1

In 334 g of ethyl cellosolve acetate were dissolved 75 g of Resin A (1), 25 g of Resin B (1) and 30 g of a condensate of 1 mole of 2,3,4,4'-tetrahydroxybenzophenone and 2.5 moles of NQD-5 (the condensate is hereinafter referred to as "1,2-Quinonediazide I"). The resulting solution was filtered through a membrane filter having a pore diameter of 0.2 µm to prepare a solution of Composition A. The solution was coated on a silicon wafer having formed thereon a silicon oxide film, by means of a spinner. The coated wafer was subjected to prebaking on a hot plate at 90° C. for 2 minutes to form a resist film having a thickness of 1.2 µm. The resist properties were measured. The results are shown in Table 1.

EXAMPLE 2

A solution of Composition A was prepared by repeating the same procedure as in Example 1, except that the 1,2-Quinonediazide I was replaced by a condensate of 1 mole of 2,3,4-trihydroxybenzophenone and 2.5 moles of NQD-5 (the condensate is hereinafter referred to as "1,2-Quinonediazide II"). A resist film was formed from the solution in the same manner as in Example 1, and measured for properties. The results are shown in Table 1.

EXAMPLE 3

A solution of Composition A was prepared by repeating the same procedure as in Example 1, except that Resin A (1) and Resin B (1) were replaced by Resin A (2) and Resin B (3), respectively. A resist film was formed from the solution in the same manner as in Example 1, and measured for properties. The results are shown in Table 1.

EXAMPLE 4

A solution of Composition A was prepared by repeating the same procedure as in Example 1, except that Resin B (1) was replaced by Resin B (2). A resist film was formed from the solution in the same manner as in Example 1, and measured for properties. The results are shown in Table 1.

EXAMPLE 5

A solution of Composition A was prepared by repeating the same procedure as in Example 1, except that 1,2-Quinonediazide I was replaced by 1,2-Quinonediazide II. A resist film was formed from the solution in the same manner as in Example 1, and measured for properties. The results are shown in Table 1.

EXAMPLE 6

A solution of Composition A was prepared by repeating the same procedure as in Example 1, except that Resin A (1) was replaced by Resin A (2). A resist film was formed from the solution in the same manner as in Example 1, and measured for properties. The results are shown in Table 1.

EXAMPLE 7

A solution of Composition A was prepared repeating the same procedure as in Example 1, except that Resin A (1) and Resin B (1) were replaced by Resin A (2) and Resin B (3), respectively. A resist film was formed from the solution in the same manner as in Example 1, and measured for properties. The results are shown in Table 1.

EXAMPLE 8

A solution of Composition A was prepared by repeating the same procedure as in Example 1, except that Resin A (1) was replaced by Resin A (3). A resist film was formed from the solution in the same manner as in Example 1, and measured for properties. The results are shown in Table 1.

EXAMPLE 9

A solution of Composition A was prepared by repeating the same procedure as in Example 1, except that Resin A (1) was replaced by Resin A (4). A resist film was formed from the solution in the same manner as in Example 1, and measured for properties. The results are shown in Table 1.

COMPARATIVE EXAMPLE 1

A solution of a resin composition was prepared by repeating the same procedure as in Example 1, except that the amount of Resin A (1) was increased to 100 g and no Resin B was used. A resist film was formed from the solution in the same manner as in Example 1, and measured for properties. The results are shown in Table 1.

COMPARATIVE EXAMPLE 2

A solution of a resin composition was prepared by repeating the same procedure as in Example 1, except that the amounts of Resin A (1) and Resin B (1) were changed to 40 g and 60 g, respectively. A resist film was formed from the solution in the same manner as in Example 1, and measured for properties. The results are shown in Table 1.

TABLE 1

| | Resin A | | | Resin B | | | 1,2-Quinonediazide | | Ethyl cello- solve acetate |
|---|---|---|---|---|---|---|---|---|---|
| | Type | $\bar{M}w$ | Amount (g) | Type | $\bar{M}w$ | Amount (g) | Type | Amount (g) | Amount (g) |
| Example | | | | | | | | | |
| 1 | A (1) | 8100 | 75 | B (1) | 590 | 25 | I | 30 | 334 |
| 2 | " | " | " | " | " | " | II | " | " |
| 3 | A (2) | 7500 | " | B (3) | 670 | " | I | " | " |
| 4 | A (1) | 8100 | " | B (2) | 610 | " | I | " | " |
| 5 | " | " | " | " | " | " | II | " | " |
| 6 | A (2) | 7500 | " | B (1) | 590 | " | I | " | " |
| 7 | " | " | " | B (3) | 670 | " | I | " | " |
| 8 | A (3) | 8900 | " | B (1) | 590 | " | I | " | " |
| 9 | A (4) | 9200 | " | " | " | " | I | " | " |
| Comparative Example | | | | | | | | | |
| 1 | A (1) | 8100 | 100 | — | — | — | I | " | " |
| 2 | " | " | 40 | B (1) | 590 | 60 | I | " | " |

| | Evaluation results | | | | |
|---|---|---|---|---|---|
| | Sensitivity (msec) | Resolution (μm) | Yield of residual film thickness (%) | Developa- bility | Heat resistance (°C.) |
| Example | | | | | |
| 1 | 200 | 0.50 | 99 | Good | 155 |
| 2 | 230 | " | 98 | " | 150 |
| 3 | 220 | " | 99 | " | 155 |
| 4 | 240 | " | " | " | " |
| 5 | 200 | " | 98 | " | 150 |
| 6 | " | " | 99 | " | 155 |
| 7 | 210 | " | " | " | " |
| 8 | 220 | " | " | " | " |

TABLE 1-continued

| 9 Comparative Example | 240 | " | " | " | " |
|---|---|---|---|---|---|
| 1 | 500 | 0.55 | " | Poor | 160 |
| 2 | 110 | 0.60 | 95 | Good | 130 |

SYNTHESIS EXAMPLE 8

Into the same separable flask as used in Synthesis Example 1 were charged the following materials:

| m-Cresol | 120.0 g (1.11 mol) |
|---|---|
| p-Cresol | 80.0 g (0.74 mol) |
| Formalin | 37.5 g (0.462 mol) |
| Oxalic acid dihydrate | 0.559 g (0.00443 mol) |

The separable flask was immersed in an oil bath, and the flask contents were subjected to polycondensation for 30 minutes with stirring while maintaining the flask interior at 100° C. to synthesize Resin B. After the completion of the reaction, the temperature of the oil bath was elevated to 180° C., and simultaneously the pressure inside the reaction vessel was reduced to 30–40 mmHg to remove water, oxalic acid, unreacted formalin and unreacted phenols. The resulting molten resin was cooled to room temperature to recover Resin B [hereinafter referred to as "Resin B (4)"].

Resin B (4) was dissolved in tetrahydrofuran to measure its $\overline{M}w$. The $\overline{M}w$ was 610.

SYNTHESIS EXAMPLE 9

Into the same separable flask as used in Synthesis Example 1 were charged 10.0 g of Resin B (4) and 11.7 g of NQD-5. Then, 107 g of acetone was added. The resulting mixture was stirred to obtain a solution. After the temperature of the flask interior was adjusted to 30° C., 4.7 g of triethylamine was slowly dropped thereinto from a dropping funnel while the temperature of the flask interior was controlled so as not to exceed 35° C. The resulting precipitate of triethylamine hydrochloride was removed by filtration. The filtrate was poured into a large amount of diluted hydrochloric acid to precipitate a condensate of Resin B (4) with NQD-5 [the condensate is hereinafter referred to as"Resin C (1)"]. Resin C (1) was recovered by filtration and dried at 40° C. for 24 hours. The dry weight was measured and the yield was 90%.

Resin C (1) was dissolved in tetrahydrofuran to measure its $\overline{M}w$. The $\overline{M}w$ was 750.

SYNTHESIS EXAMPLE 10

The same procedure as in synthesis Example 8 was repeated, except that the following materials were used, to recover Resin B [hereinafter referred to as "Resin B (5)"]:

| m-Cresol | 152.2 g (1.407 mol) |
|---|---|
| 2,3,5-Trimethylphenol | 47.8 g (0.351 mol) |
| Formalin | 35.7 g (0.44 mol) |
| Oxalic acid dihydrate | 0.532 g (0.00422 mol) |

The Resin B (5) was dissolved in tetrahydrofuran to measure its $\overline{M}w$. The $\overline{M}w$ was 630.

SYNTHESIS EXAMPLE 11

The same procedure as in Synthesis Example 9 was repeated, except that 10.0 g of Resin B (4) was replaced by 6.0 g of Resin B (5), to recover Resin C [hereinafter referred to as "Resin C (2)"].

Resin C (2) was dissolved in tetrahydrofuran to measure its $\overline{M}w$. The $\overline{M}w$ was 790.

SYNTHESIS EXAMPLE 12

Into the same separable flask as used in Synthesis Example 1 were charged the following materials:

| m-Cresol | 27.0 g (0.25 mol) |
|---|---|
| 3,5-Xylenol | 52.2 g (0.427 mol) |
| Formalin | 130.0 g (1.602 mol) |
| Oxalic acid dihydrate | 1.458 g (0.0116 mol) |

The separable flask was immersed in an oil bath, and the flask contents were subjected to polycondensation for 30 minutes with stirring while maintaining the flask interior at 100° C. Then, the following materials were added:

| m-Cresol | 107.8 g (0.997 mol) |
|---|---|
| 3,5-Xylenol | 13.0 g (0.106 mol) |

Polycondensation was effected for a further 1 hour to synthesize Resin A. The same subsequent procedure as in Synthesis Example 8 was repeated to recover Resin A [hereinafter referred to as "Resin A (5)"].

Resin A (5) was dissolved in tetrahydrofuran to measure its $\overline{M}w$. The $\overline{M}w$ was 9,200.

SYNTHESIS EXAMPLE 13

Into the same separable flask as used in Synthesis Example 1 were charged the following materials:

| m-Cresol | 121.7 g (1.125 mol) |
|---|---|
| 2,3,5-Trimethylphenol | 9.6 g (0.070 mol) |
| Formalin | 129.0 g (1.589 mol) |
| Oxalic acid dihydrate | 1.596 g (0.0127 mol) |

The separable flask was immersed in an oil bath, and the flask contents were subjected to polycondensation for 1.5 hours with stirring while maintaining the flask interior at 100° C. Then, the following materials were added:

| m-Cresol | 30.4 g (0.281 mol) |
|---|---|
| 2,3,5-Trimethylphenol | 38.3 g (0.281 mol) |

Polycondensation was effected for a further 2.5 hours to synthesize Resin A. The same subsequent procedure as in Synthesis Example 8 was repeated to recover Resin A [hereinafter referred to as "Resin A (6)"].

Resin A (6) was dissolved in tetrahydrofuran to measure its $\overline{M}w$. The $\overline{M}w$ was 10,100.

SYNTHESIS EXAMPLE 14

The same procedure as in Synthesis Example 8 was repeated, except that the following materials were used, to recover Resin B [hereinafter referred to as "Resin B (6)"]:

| | |
|---|---|
| m-Cresol | 80.0 g (0.74 mol) |
| p-Cresol | 120.0 g (0.11 mol) |
| Formalin | 37.5 g (0.462 mol) |
| Oxalic acid dihydrate | 0.559 g (0.00443 mol) |

Resin B (6) was dissolved in tetrahydrofuran to measure its $\overline{M}w$. The $\overline{M}w$ was 580.

SYNTHESIS EXAMPLE 15

The same procedure as in Synthesis Example 9 was repeated, except that 10.0 g of Resin B (4) was replaced by 10.0 g of Resin B (6), to recover Resin C [hereinafter referred to as "Resin C (3)"].

Resin C (3) was dissolved in tetrahydrofuran to measure its $\overline{M}w$. The $\overline{M}w$ was 710.

SYNTHESIS EXAMPLE 16

Into the same separable flask as used in Synthesis Example 1 were charged the following materials:

| | |
|---|---|
| m-Cresol | 82.6 g (0.764 mol) |
| p-Cresol | 37.6 g (0.348 mol) |
| 2,3,5-Trimethylphenol | 11.8 g (0.087 mol) |
| Formalin | 126.9 g (1.564 mol) |
| Oxalic acid dihydrate | 1.578 g (0.0125 mol) |

The separable flask was immersed in an oil bath, and the flask contents were subjected to polycondensation for 1 hour with stirring while maintaining the flask interior at 100° C. Then, the following materials were added:

| | |
|---|---|
| m-Cresol | 20.7 g (0.191 mol) |
| 2,3,5-Trimethylphenol | 47.3 g (0.347 mol) |

Polycondensation was effected for a further 2 hours to synthesize Resin A. The same subsequent procedure as in Synthesis Example 8 was repeated to recover Resin A [hereinafter referred to as "Resin A (7)"].

Resin A (7) was dissolved in tetrahydrofuran to measure its $\overline{M}w$. The $\overline{M}w$ was 9,900.

EXAMPLE 10

In 310 g of ethyl cellosolve acetate were dissolved 70 g of Resin A (1), 10 g of Resin B (4), 20 g of Resin C (1) and 20 g of 1,2-Quinonediazide I. The resulting solution was filtered through a membrane filter having a pore diameter of 0.2 µm to prepare a solution of Composition B. The solution was coated on a silicon wafer having formed thereon a silicon oxide film, by means of a spinner. The coated wafer was prebaked on a hot plate at 90° C. for 2 minutes to form a resist film having a thickness of 1.2 µm. The resist film was measured for resist properties. The results are shown in Table 2.

EXAMPLE 11

A solution of Composition B was prepared by repeating the same procedure as in Example 10, except that Resin B (4) was replaced by 10 g of Resin B (5) and Resin C (1) was replaced by 20 g of Resin C (2). A resist film was formed from the solution in the same manner as in Example 10 and measured for properties. The results are shown in Table 2.

EXAMPLE 12

A solution of Composition B was prepared by repeating the same procedure as in Example 10, except that 80 g of Resin A (1), 5 g of Resin B (4), 15 g of Resin C (2), 25 g of 1,2-Quinonediazide II and 310 of ethyl cellosolve acetate were used. A resist film was formed from the solution in the same manner as in Example 10 and measured for properties. The results are shown in Table 2.

EXAMPLE 13

A solution of Composition B was prepared by repeating the same procedure as in Example 10, except that 75 g of Resin A (1), 10 g of Resin B (5), 15 g of Resin C (1), 25 g of a condensate of 1 mole of 2,3,4,4'-tetrahydroxybenzophenone with 2.5 mols of NQD-4 (the condensate is hereinafter referred to as "1,2-Quinonediazide III") and 310 g of ethyl cellosolve acetate were used. A resist film was formed from the solution in the same manner as in Example 10 and measured for properties. The results are shown in Table 2.

EXAMPLE 14

A solution of Composition B was prepared by repeating the same procedure as in Example 10, except that 80 g of Resin A (5), 10 g of Resin B (4), 10 g of Resin C (2), 20 of 1,2-Quinonediazide I and 310 g of ethyl cellosolve acetate were used. A resist film was formed from the solution in the same manner as in Example 10 and measured for properties. The results are shown in Table 2.

EXAMPLE 15

A solution of Composition B was prepared repeating the same procedure as in Example 10, except that 70 g of Resin A (5), 5 g of Resin B (5), 25 g of Resin C (1), 15 g of 1,2-Quinonediazide II and 310 g of ethyl cellosolve acetate were used. A resist film was formed from the solution in the same manner as in Example 10 and measured for properties. The results are shown in Table 2.

EXAMPLE 16

A solution of Composition B was prepared by repeating the same procedure as in Example 10, except that 65 g of Resin A (6), 15 g of Resin B (4), 20 g of Resin C (1), 20 g of a condensate of 1 mole of 3'-methoxy-2,3,4,4'-tetrahydroxybenzophenone with 2.5 moles of NQD-5 (the condensate is hereinafter referred to as "1,2-Quinonediazide IV") and 310 g of ethyl cellosolve acetate were used. A resist film was formed from the solution in the same manner as in Example 10 and measured for properties. The results are shown in Table 2.

EXAMPLE 17

A solution of Composition B was prepared by repeating the same procedure as in Example 10, except that 65 g of Resin A (1), 15 g of Resin B (4), 20 g of Resin C (1), 15 g of 1,2-Quinonediazide III and 310 g of ethyl cellosolve acetate were used. A resist film was formed from the solution in the same manner as in Example 10 and measured for properties. The results are shown in Table 2.

EXAMPLE 18

A solution of Composition B was prepared by repeating the same procedure as in Example 10, except that 75 g of Resin A (6), 20 g of Resin B (6), 5 g of Resin C (3), 15 g of 1,2-Quinonediazide III and 310 g of ethyl cellosolve acetate were used. A resist film was formed from the solution in the same manner as in Example 10 and measured for properties. The results are shown in Table 2.

EXAMPLE 19

A solution of Composition B was prepared by repeating the same procedure as in Example 10, except that 70 g of Resin A (7), 15 g of Resin B (4), 15 g of Resin C (3), 20 g of 1,2-Quinonediazide I and 310 g of ethyl cellosolve acetate were used. A resist film was formed from the solution in the same manner as in Example 10 and measured for properties. The results are shown in Table 2.

COMPARATIVE EXAMPLE 3

A solution of a resin composition was prepared by repeating the same procedure as in Example 10, except that 45 g of Resin A (5), 40 g of Resin B (4), 15 g of Resin C (1), 20 g of 1,2-Quinonediazide I and 310 g of ethyl cellosolve acetate were used. A resist film was formed from the solution in the same manner as in Example 10 and measured for properties. The results are shown in Table 2.

SYNTHESIS EXAMPLE 7

Into 2000-ml autoclave were charged 86.5 g (0.8 mol) of m-cresol, 27.2 g (0.2 mol) of 2,3,5-trimethylphenol, 75.0 g (0.925 mol) of formalin (37% by weight aqueous formaldehyde solution), 7.56 g (0.06 mol) of oxalic acid dihydrate, 384.5 g of dioxane and 77.5 g of water. Thereafter, the autoclave was immersed in an oil bath and the internal temperature thereof was kept at 140° C. to effect polycondensation for 6 hours. Thereafter, the internal temperature of the autoclave was returned to the neighborhood of room temperature, and the reaction mixture was taken out and allowed to stand until the suspension was separated to two layers, after which the resin layer was taken out. Thereto was added 432 g of ethyl cellosolve acetate, and unreacted formaldehyde, dioxane and water were removed by distillation under reduced pressure, to obtain an ethyl cellosolve acetate solution. The solution thus obtained was washed with water to remove the oxalic acid used as a catalyst and the ethyl cellosolve acetate and water were removed by distillation under reduced pressure to recover Resin A [hereinafter referred to as "Resin A (8)"].

Resin A (8) was dissolved in tetrahydrofuran, and subjected to measurement of $\overline{M}w$ to find that it was 9,000.

TABLE 2

| | Resin A | | | Resin B | | | Resin C | | | 1,2-Quinonediazide | |
|---|---|---|---|---|---|---|---|---|---|---|---|
| | Type | $\overline{M}w$ | Amount (g) | Type | $\overline{M}w$ | Amount (g) | Type | $\overline{M}w$ | Amount (g) | Type | Amount (g) |
| Example | | | | | | | | | | | |
| 10 | A (1) | 8100 | 70 | B (4) | 610 | 10 | C (1) | 750 | 20 | I | 20 |
| 11 | " | " | " | B (5) | 630 | " | C (2) | 790 | " | " | " |
| 12 | " | " | 80 | B (4) | 610 | 5 | " | " | 15 | II | 25 |
| 13 | " | " | 75 | B (5) | 630 | 10 | C (1) | 750 | " | III | " |
| 14 | A (5) | 9200 | 80 | B (4) | 610 | " | C (2) | 790 | 10 | I | 20 |
| 15 | " | " | 70 | B (5) | 630 | 5 | C (1) | 750 | 25 | II | 15 |
| 16 | A (6) | 10100 | 65 | B (4) | 610 | 15 | " | " | 20 | IV | 20 |
| 17 | " | " | " | " | " | " | " | " | " | III | 15 |
| 18 | " | " | 75 | B (6) | " | 20 | C (3) | 710 | 5 | " | " |
| 19 | A (7) | 9900 | 70 | B (4) | 580 | 15 | " | " | 15 | I | 20 |
| Comparative Example | | | | | | | | | | | |
| 3 | A (6) | 10100 | 45 | " | 610 | 40 | C (1) | 750 | 15 | " | " |

| | Ethyl cellosolve acetate Amount (g) | Evaluation results | | | | |
|---|---|---|---|---|---|---|
| | | Sensitivity (msec) | Resolution (μm) | Yield of residual film thickness (%) | Heat resistance (°C.) | Developability |
| Example | | | | | | |
| 10 | 310 | 190 | 0.50 | >99 | 150 | Good |
| 11 | " | 180 | " | " | " | " |
| 12 | " | 210 | " | " | " | " |
| 13 | " | 220 | " | " | " | " |
| 14 | " | 250 | " | " | 155 | " |
| 15 | " | 260 | " | " | 150 | " |
| 16 | " | 240 | " | " | " | " |
| 17 | " | 220 | " | " | " | " |
| 18 | " | 200 | " | " | 155 | " |
| 19 | " | 230 | " | " | " | " |
| Comparative Example | | | | | | |
| 3 | " | 160 | 0.55 | 95 | 140 | " |

EXAMPLE 20

The same procedure as in Example 10 was repeated, except that 80 g of Resin A (8), 20 g of Resin B (4), 7.5 g of Resin C (1), 20 g of a condensate of 1 mole of 2,3,4,4'-tetrahydrobenzophenone and 4.0 mols of NQD-5 (the condensate is hereinafter referred to as 1,2-Quinonediazide V), 306 g of ethyl cellosolve acetate and 76.5 g of ethyl 2-hydroxypropionate were used, to prepare a solution of Composition B of this invention, and subsequently the solution was subjected to evaluation of resist properties. The results of the evaluation were as follows:

Sensitivity: 210 msec, Resolution: 0.50 μm

Yield of residual film thickness: >99%,

Heat resistance: 155° C., Developability: good.

SYNTHESIS EXAMPLE 18

Into the same separatory flask as in Synthesis Example 1 were charged 104.0 g (0.962 mol) of m-cresol, 14.0 g (0.103 mol) of 2,3,5-trimethylphenol, 125.3 g (1.544 mols) of 37% by weight aqueous formaldehyde solution (formalin) and 1.558 g (0.012 mol) of oxalic acid dihydrate, and the separator flask was immersed in an oil bath to keep the internal temperature at 100° C., at which condensation was effected for 1 hour with stirring. Thereafter, 26.0 g (0.240 mol) of m-cresol and 56.1 g (0.412 mol) of 2,3,5-trimethylphenol were added to the reaction mixture, and the resulting mixture was subjected to polycondensation for a further two hours to synthesize Resin A. After completion of the reaction, the temperature of the oil bath was elevated to 180° C. and simultaneously, the pressure in the flask was reduced to 30–50 mmHg to remove water, oxalic acid, unreacted formaldehyde, unreacted m-cresol and unreacted 2,3,5-trimethylphenol. Subsequently, molten Resin A was cooled to room temperature to recover Resin A [hereinafter referred to as "Resin A (9)"]. Resin A (9) was dissolved in tetrahydrofuran to measure its $\overline{M}w$. The $\overline{M}w$ was 4,500.

SYNTHESIS EXAMPLE 19

Into the same separatory flask as in Synthesis Example 1 were charged 27.0 g (0.250 mol) of m-cresol, 52.2 g (0.427 mol) of 3,5-xylenol, 130.3 g (1.605 mols) of formalin and 0.731 g (0.0058 mol) of oxalic acid dihydrate, and the separator flask was immersed in an oil bath to keep the internal temperature at 100° C., at which condensation was effected for 35 minutes with stirring. Thereafter, 108.0 g (0.999 mol) of m-cresol and 13.1 g (0.107 mol) of 5-xylenol were added to the reaction mixture, and the mixture was subjected to condensation for a further 90 minutes to synthesize Resin A. After completion of the reaction, the temperature of the oil bath was elevated to 180° C. and simultaneously the pressure in the flask was reduced to 30–50 mg to remove water, oxalic acid, unreacted formaldehyde, unreacted m-cresol, unreacted p-cresol and unreacted 3,5-xylenol. Subsequently, molten Resin A was cooled to room temperature to recover Resin A [hereinafter referred to as "Resin A (10)"]. Resin A (10) was dissolved in tetrahydrofuran to measure its $\overline{M}w$. The $\overline{M}w$ was 3,500.

SYNTHESIS EXAMPLE 20

Into the same separatory flask as in Synthesis Example 1 were charged 82.4 g (0.763 mol) of m-cresol, 11.8 g (0.087 mol) of 2,3,5-trimethylphenol, 37.6 g (0.348 mol) of p-cresol, 127.0 g (1.565 mols) of formalin and 1.578 g (0.0125 mol) of oxalic acid dihydrate, and the flask was immersed in an oil bath. The resulting mixture was subjected to condensation with stirring for 60 minutes while the internal temperature was kept at 100° C. Thereafter, 0.6 g (0.191 mol) of m-cresol and 47.3 g (0.348 mol) of 2,3,5-trimethylphenol were added, and the resulting mixture was subjected to condensation for a further 100 minutes to synthesize Resin A. After completion of the reaction, the temperature of the oil bath was elevated to 180° C., and simultaneously, the pressure in the flask was reduced to 30–50 mmHg to remove water, oxalic acid, unreacted formaldehyde, unreacted m-cresol, unreacted p-cresol and unreacted 2,2,5-trimethylphenol. Subsequently, the molten Resin A was cooled to room temperature to recover a resin [hereinafter referred to as "Resin A (11)"]. Resin A (11) was dissolved in tetrahydrofuran to measure its $\overline{M}w$. The $\overline{M}w$ was 5,100.

SYNTHESIS EXAMPLE 21

Into the same separatory flask as in Synthesis Example 1 were charged 17.8 g (0.165 mol) of m-cresol, 53.4 g (0.438 mol) of 3,5-xylenol, 44.4 g (0.411 mol) of p-cresol, 137.3 g (1.692 mols) of formalin and 0.146 g (0.00116 mol) of oxalic acid dihydrate, and the flask was immersed in an oil bath. The resulting mixture was subjected to condensation with stirring for 30 minutes while the internal temperature was kept at 100° C., and thereafter, 71.0 g (0.657 mol) of m-cresol and 13.4 g (0.110 mol) of 3,5-xylenol were added thereto, after which the resulting mixture was subjected to condensation for a further 45 minutes to synthesize Resin A. After completion of the reaction, the temperature of the oil bath was elevated to 180° C. and simultaneously the pressure in the flask was reduced to 30–50 mmHg to remove water, oxalic acid, unreacted formaldehyde, unreacted m-cresol, unreacted p-cresol and unreacted 3,5-xylenol. Subsequently, molten Resin A was cooled to room temperature to recover Resin A [hereinafter referred to as "Resin A (12)"]. Resin A (12) was dissolved in tetrahydrofuran to measure its $\overline{M}w$. The $\overline{M}w$ was 3,300.

SYNTHESIS EXAMPLE 22

Into the same separatory flask as in Synthesis Example 1 were charged 120.0 g (1.110 mols) of m-cresol, 80.0 g (0.740 mol) of p-cresol, 37.5 g (0.462 mol) of formalin and 0.559 g (0.00443 mol) of oxalic acid dihydrate, and the flask was immersed in an oil bath. The resulting mixture was subjected to condensation with stirring for 30 minutes while the internal temperature was kept at 100° C. to synthesize Resin B. After completion of the reaction, the temperature of the oil bath was elevated to 180° C. and simultaneously the pressure in the flask was reduced to 30–40 mg to remove water, oxalic acid, unreacted formaldehyde, unreacted m-cresol and unreacted p-cresol. Subsequently, molten Resin B was cooled to room temperature to recover Resin B [hereinafter referred to as "Resin B (7)"]. Resin B (7) was dissolved in tetrahydrofuran to measure its $\overline{M}w$. The $\overline{M}w$ was 610.

Subsequently, 10.0 g of Resin B (7) (the number of OH groups=0.083 mol, provided that the number of OH groups is a value calculated by dividing the weight of Resin B (7), 10.0 g, by the molecular weight of one recurring unit

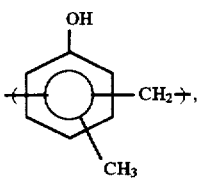

120.15, and 13.3 g (0.052 mol) of NQD-5 were charged into the same separatory flask as in Synthesis Example 1, and 107 g of acetone was further charged thereinto. They were stirred to form a solution. Into a dropping funnel was separately charged 5.8 g of triethylamine, and the separatory flask was immersed in a water bath kept at 30° C. When the internal temperature of the flask became constant at 30° C., the triethylamine was gradually dropped into the flask so that the internal temperature did not exceed 35° C., after which the triethylamine hydrochloride precipitated was removed by filtration. The filtrate was poured into a large amount of dilute hydrochloric acid to precipitate an ester of Resin B (7) with NQD-5 [hereinafter referred to as "Resin C (4)"]. This was recovered by filtration and dried at 40° C. for 24 hours. The yield obtained by measuring the dry weight was 90%. Resin C (4) was dissolved in tetrahydrofuran to measure its $\overline{Mw}$. The $\overline{Mw}$ was 770.

SYNTHESIS EXAMPLE 23

The same procedure as in Synthesis Example 18 was repeated, except that into the same separatory flask as in Synthesis Example 1 were charged 152.2 g (1.407 mols) of m-cresol, 47.8 g (0.351 mol) of 2,3,5-trimethylphenol, 35.7 g (0.440 mol) of formalin and 0.532 g (4.22×10⁻³ mol) of oxalic acid dihydrate, to obtain Resin B [hereinafter referred to as "Resin B (8)"]. Resin B (8) was dissolved in tetrahydrofuran to measure its $\overline{Mw}$. The $\overline{Mw}$ was 630.

Subsequently, 10.0 g of Resin B (8) [the number of OH groups=0.080 mol) and 15.0 g (0.056 mol) of NQD-4 were charged into the same separatory flask as in Synthesis Example 1, and the resulting mixture was subjected to the same subsequent treatment as in the case of Resin C (4) to obtain an ester of Resin C (4) with NQD-4 [hereinafter referred to as "Resin C (5)"]. The yield was 92%. Resin C (5) was dissolved in tetrahydrofuran to measure its $\overline{Mw}$. The $\overline{Mw}$ was 830.

SYNTHESIS EXAMPLE 24

Into the same separatory flask as in Synthesis Example 1 were charged 122 g (1.0 mol) of 2,6-dimethylphenol, 42.0 g (0.52 mol) of formalin and 0.50 g (3.97×10⁻³ mol), and the separatory flask was immersed in an oil bath. The resulting mixture was subjected to polycondensation for 4 hours while the internal temperature of the flask was kept at 100° C., to synthesize Resin B. After completion of the reaction, the temperature of the oil bath was elevated to 180° C. and simultaneously the pressure in the flask was reduced to 30–40 mmHg to remove water, oxalic acid, unreacted formaldehyde and unreacted 2,6-dimethylphenol. Subsequently, molten Resin B was cooled to room temperature to recover Resin B [hereinafter referred to as Resin B (9)]. Resin B (9) was dissolved in tetrahydrofuran to measure its $\overline{Mw}$. The $\overline{Mw}$ was 570. It was clarified that Resin B (9) was bis(3,5-dimethyl-4-hydroxyphenyl)methane by measuring ¹H-NMR and mass spectrum thereof.

EXAMPLE 21

In 310 g of ethyl cellosolve acetate were dissolved 90 g of Resin A (9), 10 g of Resin C (4) and 20 g of a condensate of 1 mol of 2,3,4,4'-tetrahydroxybenzophenone with 3.6 mols of NQD-5 [hereinafter referred to as "1,2-Quinonediazide (V)"], and the resulting solution was filtered through a membrane filter having a pore diameter of 0.2 µm, to prepare a solution of the present composition. The solution thus obtained was coated on a silicon wafer having a silicon oxide film by means of a spinner, and then prebaked on a hot plate at 90° C. for 2 minutes, to form a resist film having a thickness of 1.2 µm. This resist film was subjected to a test for properties with regard to sensitivity, resolution, yield of residual film thickness, developability, heat resistance and exposure margin. The results are shown in Table 3.

EXAMPLE 22

The same procedure as in Example 21 was repeated, except that 90 g of Resin A (9), 10 9 of Resin C (4) and 20 g of a condensate of 1 mole of 2,3,4,4'-tetrahydroxybenzophenone with 3.5 mols of NQD-4 [hereinafter referred to as "1,2-Quinonediazide (VI)"] were used, to obtain a composition of this invention. A resist formed from the composition was subjected to a test for properties. The results are shown in Table 3.

EXAMPLE 23

The same procedure as in Example 21 was repeated, except that 85 g of Resin A (10), 15 g of Resin C (4) and 20 g of a condensate of 1 mol of 2,3,4,4'-tetrahydroxy-3'-methoxybenzophenone with 3.7 mols of NQD-5 [hereinafter referred to as "1,2-Quinonediazide (VII)"] were used, to obtain a composition of this invention. A resist formed from this composition was subjected to a test for properties. The results are shown in Table 3.

EXAMPLE 24

The same procedure as in Example 21 was repeated, except that 93 g of Resin A (9), 7 g of Resin C (4) and 20 g of 1,2-Quinonediazide (VII) were used, to obtain a composition of this invention. A resist formed from this composition was subjected to a test for properties. The results are shown in Table 3.

EXAMPLE 25

The same procedure as in Example 21 was repeated, except that 90 g of Resin A (9), 10 g of Resin C (5) and 20 g of 1,2-Quinonediazide (V) were used to obtain a composition of this invention. A resist formed from this composition was subjected to a test for properties. The results are shown in Table 3.

EXAMPLE 26

The same procedure as in Example 21 was repeated, except that 80 q of Resin A (10), 20 g of Resin C (5) and 25 g of 1,2-Quinonediazide (V) were dissolved in 290 g of ethyl cellosolve acetate, to obtain a composition of this invention. A resist formed from this composition was subjected to a test for properties. The results are shown in Table 3.

EXAMPLE 27

The same procedure as in Example 21 was repeated, except that 85 g of Resin A (11), 15 g of Resin C (5) and 20 g of 1,2-Quinonediazide (V) were used, to obtain a composition of this invention. A resist formed from this composition was subjected to a test for properties. The results are shown in Table 3.

EXAMPLE 28

The same procedure as in Example 21 was repeated, except that 90 g of Resin A (12), 10 g of Resin C (4) and 20 g of 1,2-Quinonediazide (VI) were used, to obtain a composition of this invention. The results are shown in Table 3.

EXAMPLE 29

The same procedure as in Example 21 was repeated, except that 80 g of Resin A (8), 20 g of Resin B (9), 7.5 g of Resin C (1), 20 g of a condensate of 1 mol of 2,3,4,4'-tetrahydroxybenzophenone with 4 mols of NQD-5 [hereinafter referred to as "1,2-Quinonediazide (VIII)"], 306 g of ethyl cellosolve acetate and 76.5 g of ethyl 2-hydroxypropionate were used, to obtain a composition of this invention. A resist formed from this composition was subjected to a test for properties. The results of the evaluation were as follows:

| Sensitivity | 190 msec. |
| --- | --- |
| Resolution | 0.50 μm |
| Yield of residual film thickness | >99% |
| Heat resistance | 155° C. |
| Developability | Good |

COMPARATIVE EXAMPLE 4

The same procedure as in Example 21 was repeated, except that 100 g of Resin A (9) and 20 g of 1,2-Quinonediazide (V) were used, to obtain a composition. A resist formed from this composition was subjected to a test for properties. The results are shown in Table 3.

TABLE 3

| | Resin A | | | | | Resin C | | | 1,2-Quinone-diazide | |
| --- | --- | --- | --- | --- | --- | --- | --- | --- | --- | --- |
| | | | GPC | | Amount | | | Amount | | Amount |
| | Type | $\bar{M}w$ | a/b | c/b | (g) | Type | $\bar{M}w$ | (g) | Type | (g) |
| Ex. | | | | | | | | | | |
| 21 | A (9) | 5400 | 0.90 | 0.51 | 90 | C (4) | 770 | 10 | V | 20 |
| 22 | " | " | " | " | " | " | " | " | VI | " |
| 23 | A (10) | 3500 | " | " | 85 | " | " | 15 | VII | " |
| 24 | A (9) | 4500 | " | " | 93 | " | " | 7 | " | " |
| 25 | " | " | " | " | 90 | C (5) | 830 | 10 | V | " |
| 26 | A (10) | 3500 | 0.70 | 0.72 | 80 | " | " | 20 | " | 25 |
| 27 | A (11) | 5100 | 1.01 | 0.48 | 85 | " | " | 15 | " | 20 |
| 28 | A (12) | 3300 | 0.67 | 0.65 | 90 | C (4) | 770 | 10 | VI | " |
| Comp. Ex. | | | | | | | | | | |
| 4 | A (9) | 4500 | 0.90 | 0.51 | 100 | — | — | — | V | " |

| | | Results of evaluation | | | | | |
| --- | --- | --- | --- | --- | --- | --- | --- |
| | Ethyl cellosolve acetate amount (g) | Sensitivity (msec) | Resulution (μm) | Yield of residual thickness (%) | Developability | Heat resistance (°C.) | Exposure margin |
| Ex. | | | | | | | |
| 21 | 310 | 220 | 0.50 | >99 | Good | 155 | 0.49 |
| 22 | " | 240 | " | " | " | " | 0.50 |
| 23 | " | 190 | " | " | " | 150 | 0.47 |
| 24 | " | 290 | " | " | " | 155 | 0.58 |
| 25 | " | 250 | " | " | " | " | 0.51 |
| 26 | 290 | " | " | " | " | 150 | 0.44 |
| 27 | 310 | 300 | " | " | " | 155 | 0.46 |
| 28 | " | 230 | " | " | " | " | 0.52 |
| Comp. Ex. | | | | | | | |
| 4 | " | 170 | 0.55 | " | " | " | 0.71 |

What is claimed is:

1. A radiation-sensitive resin composition consisting of (1) an alkali-soluble novolak resin, (2) a 1,2-quinonediazide compound and (3) a solvent, wherein the alkali-soluble novolak resin consists of a mixture of:

95–50 parts by weight of resin A having a standard polystyrene-reduced weight-average molecular weight of 2,000–20,000, wherein resin A is (i) a resin obtained by polycondensation of phenolic ingredients consisting of m-cresol and at least one of 2,3,5-trimethylphenol, 2,3-xylenol and 3,4-xylenol with at least one aldehyde, (ii) a resin obtained by polycondensation of phenolic ingredients consisting of m-cresol, p-cresol and at least one of 2,3,5-trimethylphenol, 2,3-xylenol and 3,4-xylenol with at least one aldehyde, or (iii) a combination of resins (i) and (ii), and 5–50 parts by weight by resin B having a standard polystyrene-reduced weight-average molecular weight of 200–2,000, wherein resin B is a resin obtained by polycondensation of at least one phenol represented by the structural formula (II):

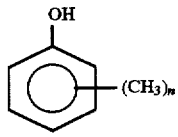

wherein n is 0,1,2 or 3, with at least one aldehyde.

2. A radiation-sensitive resin composition consisting of (1) an alkali-soluble novolak resin, (2) a 1,2-quinonediazide compound, (3) a solvent and (4) at least one member selected from the group consisting of a sensitizer, a surface active agent, a dye, a storage stability improver, a pigment and an antifoaming agent, wherein the alkali-soluble novolak resin consists of a mixture of:

95–50 parts by weight of resin A having a standard polystyrene-reduced weight-average molecular weight of 2,000–20,000, wherein resin A is (i) a resin obtained by polycondensation of phenolic ingredients consisting of m-cresol and at least one of 2,3,5-trimethylphenol, 2,3-xylenol and 3,4-xylenol with at least one aldehyde, (ii) a resin obtained by polycondensation of phenolic ingredients consisting of m-cresol, p-cresol and at least one of 2,3,5-trimethylphenol, 2,3-xylenol and 3,4-xylenol with at least one aldehyde, or (iii) a combination of resins (i) and (ii), and 5–50 parts by weight by resin B having a standard polystyrene-reduced weight-average molecular weight of 200–2,000, wherein resin B is a resin obtained by polycondensation of at least one phenol represented by the structural formula (II):

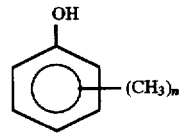

wherein n is 0,1,2 or 3, with at least one aldehyde.

3. A radiation-sensitive resin composition according to claim 2, wherein the at least one phenol represented by the structural formula (II) is selected from the group consisting of phenol, o-cresol, m-cresol, 2,3-xylenol, 2,4-xylenol, 2,5-xylenol, 2,6-xylenol, 3,4-xylenol, 3,5-xylenol, 3,6-xylenol, 2,3,5-trimethylphenol and 3,4,5-trimethylphenol.

4. A radiation-sensitive resin composition according to claim 2, wherein the at least one aldehyde is selected from the group consisting of formaldehyde, paraformaldehyde, benzaldehyde, furfural and acetaldehyde.

5. A radiation-sensitive resin composition according to claim 2, wherein Resin A has a standard polystyrene-reduced weight-average molecular weight of 4,000–20,000.

6. A radiation-sensitive resin composition according to claim 2, wherein Resin B has a standard polystyrene-reduced weight-average molecular weight of 300–1,000.

7. A radiation-sensitive resin composition according to claim 2, wherein in Resin A, the amount of the at least one aldehyde used is 0.7–3 mole per mole of the at least one phenol.

8. A radiation-sensitive resin composition according to claim 2, wherein in Resin B, the amount of the at least one aldehyde used is 0.1–1.5 moles per mole of the at least one phenol.

9. A radiation-sensitive resin composition according to claim 2, wherein the 1,2-quinonediazide compound is at least one compound selected from the group consisting of 1,2-benzoquinonediazide-4-sulfonic acid esters, 1,2-naphthoquinonediazide-4-sulfonic acid esters and 1,2-naphthoquinonediazide-5-sulfonic acid esters.

10. A radiation-sensitive resin composition according to claim 2, wherein the molar ratio of m-cresol to said at least one of 2,3,5-trimethylphenol, 2,3-xylenol or 3,4-xylenol is 20/80 to 95/5.

11. A radiation-sensitive resin composition according to claim 2, wherein the molar ratio of m-cresol to p-cresol to said at least one of 2,3,5-trimethylphenol, 2,3-xylenol or 3,4-xylenol is 20–90/5–75/5–75 (the total of the three is 100 moles).

12. A radiation-sensitive resin composition according to claim 1, wherein the at least one phenol represented by the structural formula (II) is selected from the group consisting of phenol, o-cresol, m-cresol, 2,3-xylenol, 2,4-xylenol, 2,5-xylenol, 2,6-xylenol, 3,4-xylenol, 3,5-xylenol, 3,6-xylenol, 2,3,5-trimethylphenol and 3,4,5-trimethylphenol.

13. A radiation-sensitive resin composition according to claim 1, wherein the at least one aldehyde is selected from the group consisting of formaldehyde, paraformaldehyde, benzaldehyde, furfural and acetaldehyde.

14. A radiation-sensitive resin composition according to claim 1, wherein Resin A has a standard polystyrene-reduced weight-average molecular weight of 4,000–23,000.

15. A radiation-sensitive resin composition according to claim 1, wherein Resin B has a standard polystyrene-reduced weight-average molecular weight of 300–1,000.

16. A radiation-sensitive resin composition according to claim 1, wherein in Resin A, the amount of the at least one aldehyde used is 0.7–3 mole per mole of the at least one phenol.

17. A radiation-sensitive resin composition according to claim 1, wherein in Resin B, the amount of the at least one aldehyde used is 0.1–1.5 moles per mole of the at least one phenol.

18. A radiation-sensitive resin composition according to claim 1, wherein the 1,2-quinonediazide compound is at least one compound selected from the group consisting of 1,2-benzoquinonediazide-4-sulfonic acid esters, 1,2-naphthoquinonediazide-4-sulfonic acid esters and 1,2-naphthoquinonediazide-5-sulfonic acid esters.

19. A radiation-sensitive resin composition according to claim 1, wherein the molar ratio of m-cresol to said at least one of 2,3,5-trimethylphenol, 2,3-xylenol or 3,4-xylenol is 20/80 to 95/5.

20. A radiation sensitive resin composition according to claim 1, wherein the molar ratio of m-cresol to p-cresol to said at least one of 2,3,5-trimethylphenol, 2,3-xylenol or 3,4-xylenol is 20–90/5–75/5–75 (the total of the three is 100 moles).

21. A method of forming a developed image on a substrate, comprising:

applying the radiation sensitive resin composition of claim 2 to a substrate;

exposing the applied composition in imagewise fashion to activating radiation; and developing the image by applying a developer solution to the radiation exposed resin composition.

* * * * *

UNITED STATES PATENT AND TRADEMARK OFFICE
CERTIFICATE OF CORRECTION

PATENT NO. : 5,753,406
DATED : May 19, 1998
INVENTOR(S) : Satoshi MIYASHITA, et al.

It is certified that error appears in the above-identified patent and that said Letters Patent is hereby corrected as shown below:

On the title page, Item [*], the Terminal Disclaimer information is incorrect. It should read:

--[*]  Notice:   The portion of the term of this patent subsequent to Dec. 26, 2012 has been disclaimed.--

Signed and Sealed this

Twentieth Day of April, 1999

Attest:

Q. TODD DICKINSON

Attesting Officer

Acting Commissioner of Patents and Trademarks